United States Patent
Jong et al.

(10) Patent No.: US 10,658,342 B2
(45) Date of Patent: May 19, 2020

(54) VERTICALLY STACKED MULTICHIP MODULES

(71) Applicant: SEMICONDUCTOR COMPONENTS INDUSTRIES, LLC, Phoenix, AZ (US)

(72) Inventors: Mankyo Jong, Bucheon-si (KR); Changyoung Park, Ilsan-si (KR)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

(21) Appl. No.: 16/564,772

(22) Filed: Sep. 9, 2019

(65) Prior Publication Data
US 2019/0393196 A1     Dec. 26, 2019

Related U.S. Application Data

(63) Continuation of application No. 15/793,018, filed on Oct. 25, 2017, now Pat. No. 10,483,237.
(Continued)

(51) Int. Cl.
*H01L 25/065*     (2006.01)
*H01L 23/498*     (2006.01)
(Continued)

(52) U.S. Cl.
CPC .... *H01L 25/0657* (2013.01); *H01L 23/49894* (2013.01); *H01L 25/50* (2013.01);
(Continued)

(58) Field of Classification Search
CPC ....... H01L 2224/97; H01L 2224/32145; H01L 25/0657; H01L 23/49827
See application file for complete search history.

(56) References Cited

U.S. PATENT DOCUMENTS 6,489,687 B1    12/2002   Hashimoto
7,066,741 B2     6/2006   Burns et al.
(Continued)

OTHER PUBLICATIONS

J. Gronvall et al., "A New Approach to Power Electronics System Integration with Enhanced Cooling Solutions", Infineon Technologies AG, Apr. 14, 2015.
(Continued)

*Primary Examiner* — Zandra V Smith
*Assistant Examiner* — John M Parker
(74) *Attorney, Agent, or Firm* — Brake Hughes Bellermann LLP

(57) ABSTRACT

In a general aspect, a method for producing a circuit assembly can include coupling a first side of a first semiconductor die with a first side of a first substrate and a first side of a second substrate, the first substrate having a first electrically isolated metal layer disposed on a second side. The method can also include coupling a first side of a second semiconductor die with a second side of the second substrate and a first side of a third substrate, the third substrate having a second electrically isolated metal layer disposed on a second side. The method can further include coupling at least one conductive connector between the second substrate and the third substrate, the at least one conductive connector electrically coupling the second substrate with the third substrate.

19 Claims, 10 Drawing Sheets

Related U.S. Application Data

(60) Provisional application No. 62/420,813, filed on Nov. 11, 2016.

(51) Int. Cl.
    *H01L 25/00*     (2006.01)
    *H01L 23/00*     (2006.01)
    *H01L 23/473*     (2006.01)

(52) U.S. Cl.
    CPC ...... *H01L 23/473* (2013.01); *H01L 23/49827* (2013.01); *H01L 24/33* (2013.01); *H01L 24/83* (2013.01)

(56) References Cited

U.S. PATENT DOCUMENTS

| | | | |
|---|---|---|---|
| 7,468,553 | B2 | 12/2008 | Szewerenko et al. |
| 8,872,312 | B2 * | 10/2014 | Wang .................. H01L 23/3128 257/659 |
| 2008/0265434 | A1 | 10/2008 | Kurita |
| 2009/0294938 | A1 | 12/2009 | Chen |
| 2015/0061121 | A1 * | 3/2015 | Liao .................... H01L 23/5384 257/737 |

OTHER PUBLICATIONS

Yasuyuki Sakai et al., "Power Control Unit for High Power Hybrid System", SAE Technical Paper Series, Apr. 16-19, 2007.

\* cited by examiner

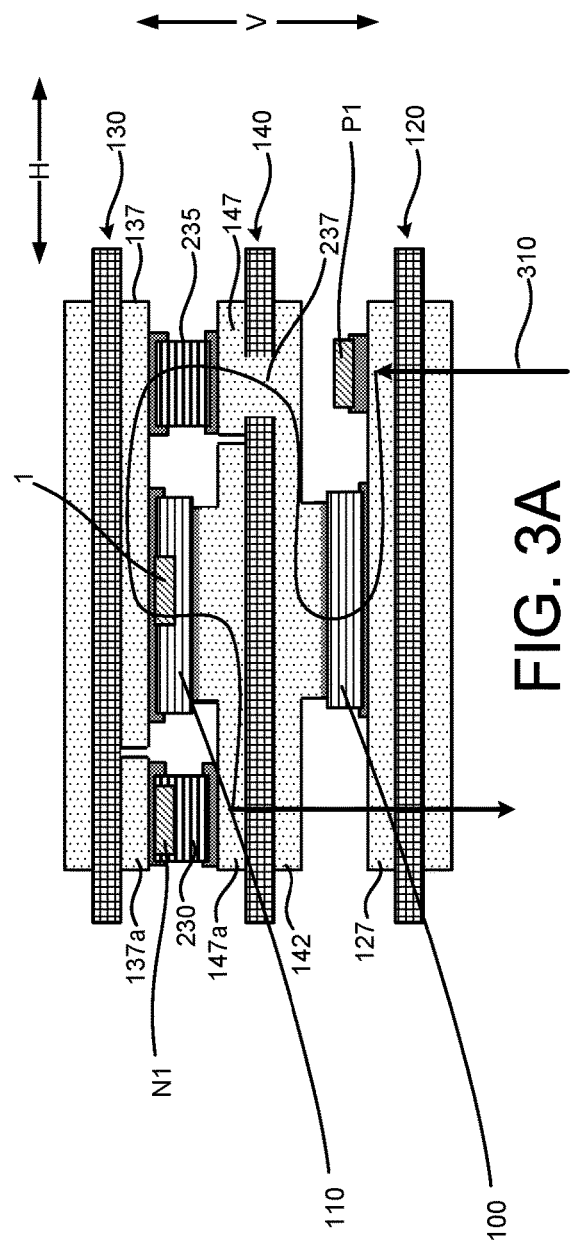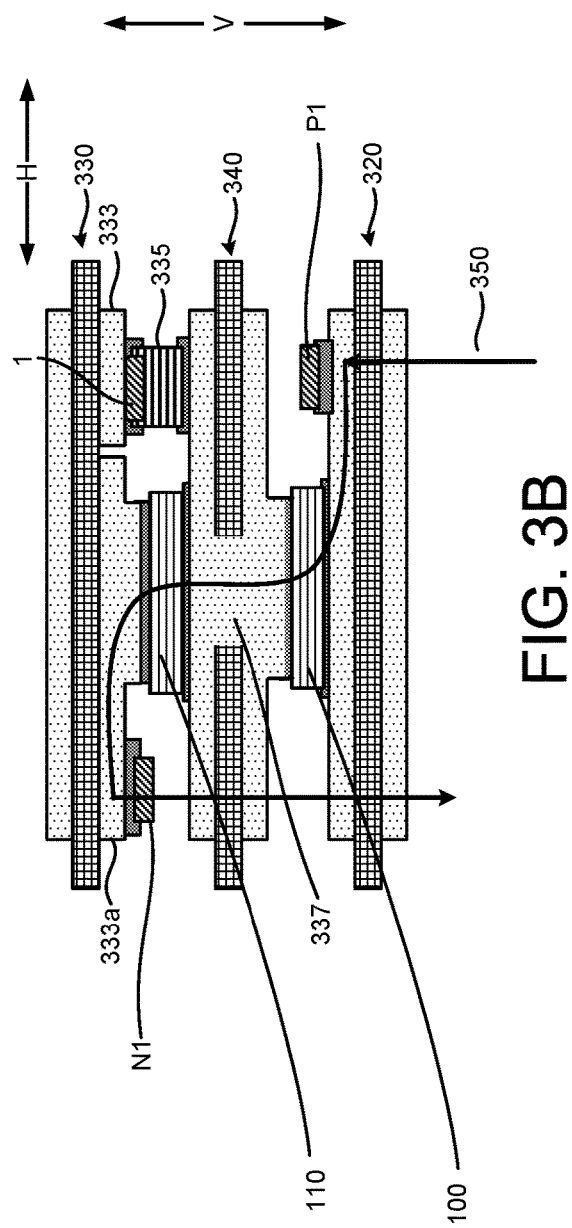

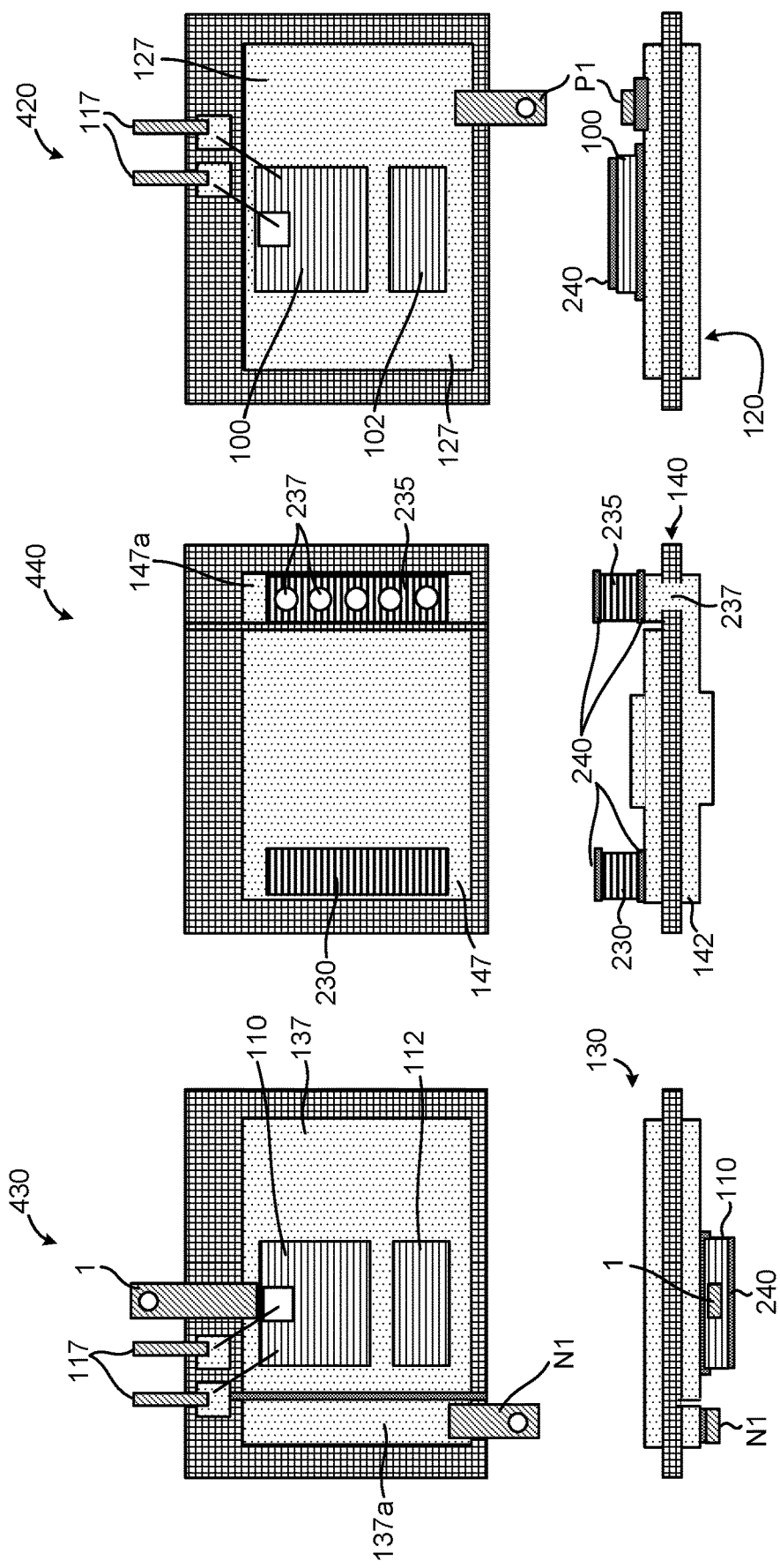

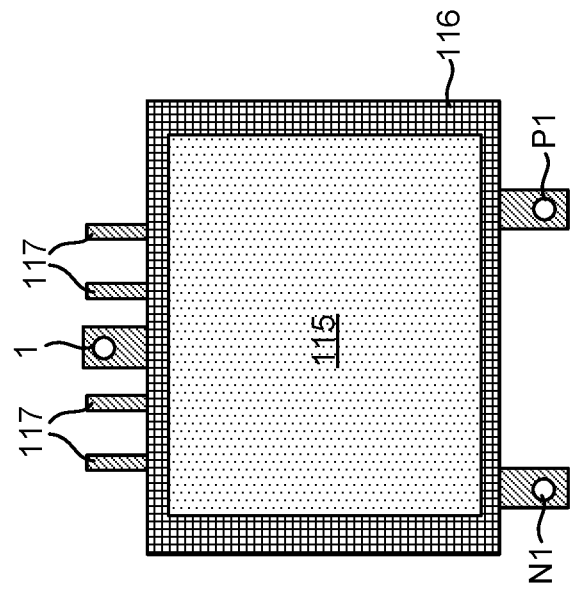
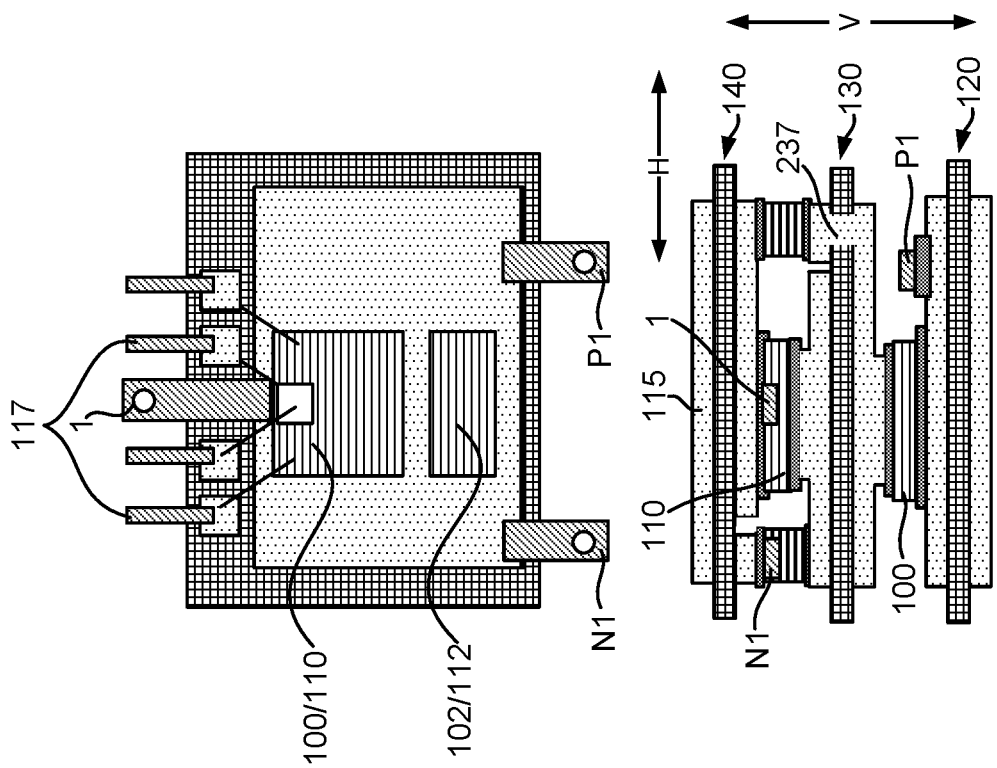
FIG. 5E
FIG. 5D

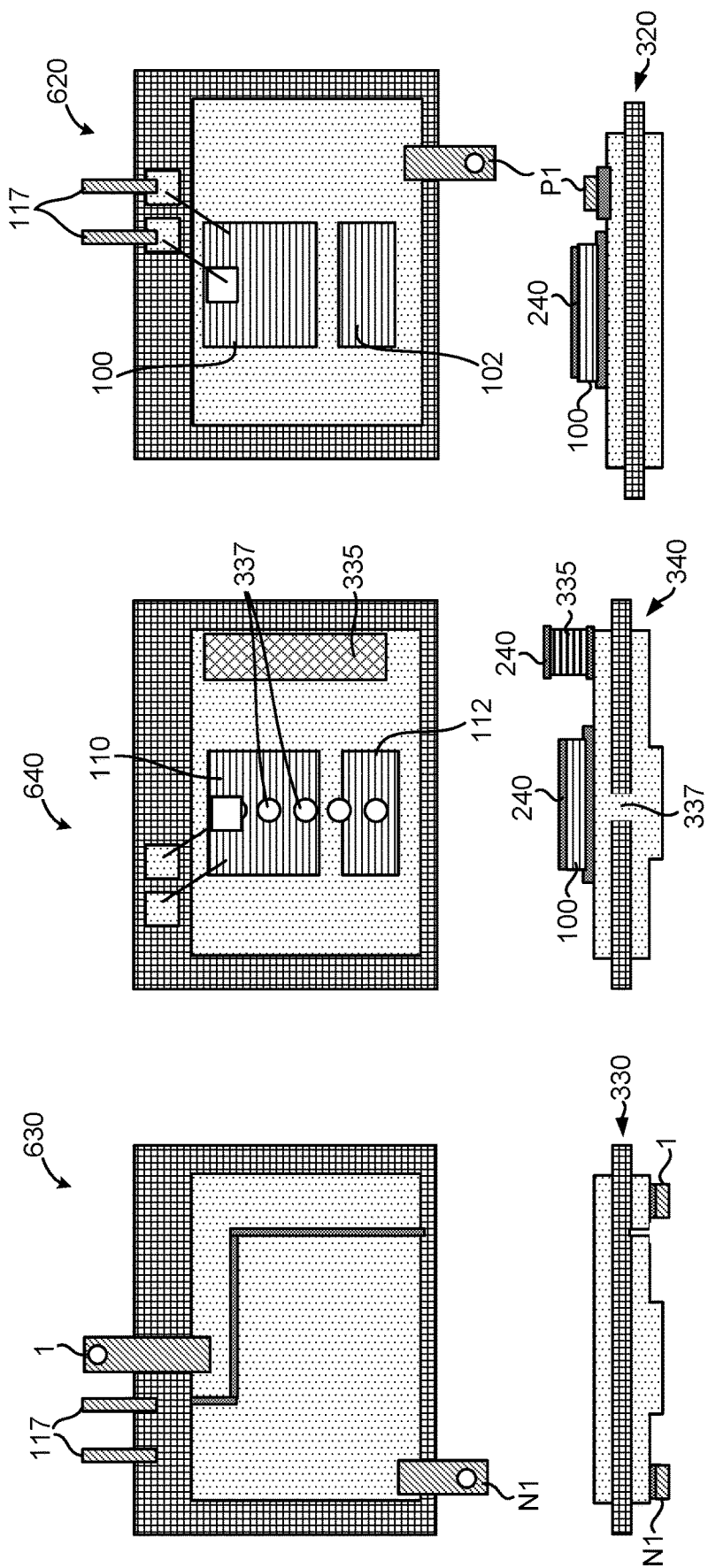

VERTICALLY STACKED MULTICHIP MODULES

CROSS-REFERENCE TO RELATED APPLICATION

This application is continuation of U.S. patent application Ser. No. 15/793,018, filed Oct. 25, 2017, entitled "VERTICALLY STACKED MULTICHIP MODULES", now U.S. Pat. No. 10,483,237, which claims priority to, and the benefit of U.S. Provisional Patent Application No. 62/420,813 filed Nov. 11, 2016, entitled "VERTICALLY STACKED MULTICHIP MODULES", both disclosures of which are hereby incorporated by reference in their entireties.

TECHNICAL FIELD

This description relates to circuit assemblies. More specifically, this description relates to vertically stacked circuit assemblies that can be used to implement multichip power semiconductor modules, and corresponding methods of manufacture.

SUMMARY

In a general aspect, a method for producing a circuit assembly can include coupling a first side of a first semiconductor die with a first metal layer disposed on a first side of a first insulating layer of a first substrate, the first semiconductor die being electrically coupled with the first metal layer. The method can also include coupling a first side of a second semiconductor die with a second metal layer disposed on a second side of the first insulating layer, the second side of the first insulating layer being opposite the first side of the first insulating layer, the first side of the second semiconductor die being electrically coupled with the second metal layer. The method can further include coupling a second side of the first semiconductor layer with a third metal layer disposed on a first side of a second insulating layer of a second substrate, the second side of the first semiconductor die being electrically coupled with the third metal layer, the second side of the first semiconductor die being opposite the first side of the first semiconductor die. The first substrate can include a conductive via disposed through the first insulating layer, the conductive via electrically coupling the first metal layer with the second metal layer. The first metal layer, the conductive via and the second metal layer can electrically couple the first semiconductor die with the second semiconductor die. The second substrate can include a fourth metal layer disposed on a second side of the second insulating layer, the second side of the second insulating layer being opposite the first side of the second insulating layer, the fourth metal layer being electrically isolated from the third metal layer by the second insulating layer.

In another general aspect, a method for producing a circuit assembly can include coupling a first side of a first semiconductor die with a first metal layer disposed on a first side of a first insulating layer of a first substrate, the first side of the first semiconductor die being electrically coupled with the first metal layer. The method can also include coupling a first side of a second semiconductor die with a second metal layer disposed on a second side of the first insulating layer, the second side of the first insulating layer being opposite the first side of the first insulating layer, the first side of the second semiconductor die being electrically coupled with the second metal layer, the first insulating layer electrically isolating the first metal layer from the second metal layer. The first substrate can include a third metal layer disposed on the second side of the insulating layer, the third metal layer being electrically isolated from the second metal layer. The first substrate can also include a conductive via disposed through the first insulating layer, the conductive via electrically coupling the first metal layer with the third metal layer. The method can further include coupling a second side of the second semiconductor die with a fourth metal layer disposed on a first side of a second insulating layer of a second substrate, the second semiconductor die being electrically coupled with the fourth metal layer, the second side of the second semiconductor die being opposite the first side of the second semiconductor die. The method can also include coupling a conductive connector between the third metal layer and the fourth metal layer, the conductive connector electrically coupling the third metal layer with the fourth metal layer. The first metal layer, the conductive via, the third metal layer, the conductive connector and the fourth metal layer can electrically couple the first semiconductor die with the second semiconductor die. The first metal layer and the conductive via can electrically couple the first semiconductor die with the third metal layer. The second substrate can include a fifth metal layer disposed on a second side of the second insulating layer, the second side of the second insulating layer being opposite the first side of the second insulating layer, the fifth metal layer being electrically isolated from the fourth metal layer by the second insulating layer.

In another general aspect, a method for producing a circuit assembly can include coupling a first side of a first semiconductor die with a first side of a first substrate and a first side of a second substrate, the first substrate having a first electrically isolated metal layer disposed on a second side, the second side of the first substrate being opposite the first side of the first substrate. The method can further include coupling a first side of a second semiconductor die with a second side of the second substrate and a first side of a third substrate, the third substrate having a second electrically isolated metal layer disposed on a second side, the second side of the third substrate being opposite the first side of the third substrate. The method can also include coupling at least one conductive connector between the second substrate and the third substrate, the at least one conductive connector electrically coupling the second substrate with the third substrate. The first substrate, the first semiconductor die, the second substrate, the second semiconductor die and the third substrate can being arranged in a vertical stack, such that current flows in the circuit assembly from the first substrate to the third substrate through the first semiconductor die, the second substrate, the second semiconductor die, and the at least one conductive connector.

BRIEF DESCRIPTION OF THE DRAWINGS

FIG. 3A is flattened, side-view of the circuit assembly of FIG. 1C, showing a current path in the circuit assembly, according to an implementation.

FIG. 3B is a flattened, side-view of another circuit assembly that can be used to implement the circuit of FIG. 1A, showing a current path in the circuit assembly, according to an implementation.

FIG. 5A is a diagram illustrating a plan view and a corresponding flattened, side-view of a first substrate assembly of the circuit assembly of FIG. 4 according to an implementation.

FIG. 5B is a diagram illustrating a plan view and a corresponding flattened, side-view of a second substrate assembly of the circuit assembly of FIG. 4, according to an implementation.

FIG. 5C is a diagram illustrating a plan view and a corresponding flattened, side-view of a third substrate assembly of the circuit assembly of FIG. 4, according to an implementation.

FIG. 5D is a diagram illustrating a plan view of a multichip module including the circuit assembly of FIG. 1C and a corresponding flattened, side-view, according to an implementation.

FIG. 5E is a diagram illustrating a package outline view of the multichip module of 5D, according to an implementation.

FIG. 6A is a diagram illustrating a plan view and a corresponding flattened, side-view of a first substrate assembly of the circuit assembly of FIG. 3B, according to an implementation.

FIG. 6B is a diagram illustrating a plan view and a corresponding flattened, side-view of a second substrate assembly of the circuit assembly of FIG. 3B, according to an implementation.

FIG. 6C is a diagram illustrating a plan view and a corresponding flattened, side-view of a third substrate assembly of the circuit assembly of FIG. 3B, according to an implementation.

DETAILED DESCRIPTION

Figure 1C:
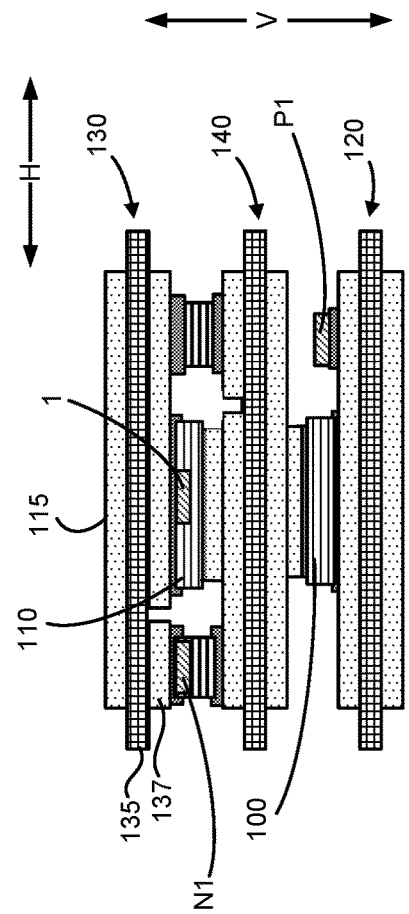
FIG. 1C is a flattened, side-view of a circuit assembly that can be used implement the circuit of FIG. 1A and included in the circuit assembly of FIG. 1B, according to an implementation.

This disclosure relates to implementations of circuit assemblies (e.g., illustrated in FIGS. 1A-6E) that can be used to implement power semiconductor device multichip modules (MCMs). A number of example embodiments are described with respect to the various drawings, which can have similar elements. In the following description and the related drawings, an element of one implementation may be described and/or labeled in the figures, while a similar element in another implementation (or view) may not be described and/or labeled in the figures. Further, aspects of one implementation can, where appropriate be included in other implementations, though such elements may not be explicitly shown in the drawings or described herein.

Implementations described herein can be used to implement high density, vertically stacked structures (circuit assemblies) for power semiconductor modules (e.g., power semiconductor MCMs) where power semiconductor chips (e.g., devices, integrated circuits, etc.) are arranged (stacked) vertically. As used in this disclosure, vertically stacked can refer to elements that are arranged (stacked, etc.) in a direction that is along an axis, such as elements that are arranged along the axis V shown in FIGS. 1C, 2, 3A, 3B, 5D and 6D.

In the context of the present disclosure, high density can refer to an amount of surface area utilized by such vertically stacked power semiconductor MCMs (e.g., the MCM structures shown in FIGS. 1C, 2, 3A, 3B, 5D and 6D) on a corresponding circuit board, such as compared to implementations of power semiconductor multichip modules where power semiconductor chips are arranged horizontally with one another, or laterally displaced (e.g., along an axis H that is orthogonal to the axis V shown) with respect to each other in the MCM. Said another way, the vertically stacked circuit assemblies described herein may utilize less surface area than horizontally arranged MCM assemblies implementing equivalent circuits. For purposes of illustrations, the implementations described herein are discussed as including power semiconductor devices, such as insulated-gate bipolar transistor (IGBT) devices. In other instances, the implementations described here can include other types of semiconductor devices.

Such vertically stacked circuit assemblies can include two outer substrates (e.g., a lower, or first substrate and an upper, or second substrate), and an inter-substrate (or third substrate). A first power semiconductor device (or other power semiconductor device) can be disposed between the lower (first) substrate and the inter-substrate (third substrate), and a second power semiconductor device can be disposed between the inter-substrate (third substrate) and the upper (second) substrate. In such implementations, the inter-substrate can electrically interconnect the first power semiconductor device and the second power semiconductor device. That is, the inter-substrate can provide a conduction path, signal path, current path, etc. between the first semiconductor device and the second semiconductor device.

In an example implementation, if the first and second power semiconductor devices are, respectively, first and second IGBT devices, the inter-substrate can electrically interconnect a collector terminal of the first IGBT device with an emitter terminal of the second IGBT device, either directly or through the second (upper) substrate or the first (lower) substrate. In some implementations, electrical connections to other terminals of the power semiconductor devices can be implemented on the first (outer) substrate, the second (outer) substrate and/or the inter-substrate. In other implementations, other arrangements, and use of other power semiconductor devices, or other types of semiconductor devices are possible.

Vertically stacked, MCM circuit assemblies, such as the implementations described herein, also allow for overlap and/or vertical alignment in (of) a main current path (e.g., a current path between a power supply and electrical ground through the power semiconductor device of a vertically stacked MCM, such as the current paths 310 and 350 illustrated, respectively, in the example implementations of FIGS. 3A and 3B). This overlap (current path 310) or vertical alignment (current path 350) can reduce stray inductance in vertically arranged MCMs (e.g., inductance resulting from magnetic fields generated by current flowing through power semiconductor devices of an MCM), as compared with stray inductance in horizontally arranged MCMs implementing substantially equivalent (schematically equivalent) circuits having non-overlapping and/or longer current paths. For instance, overlap can increase overlap between respective magnetic fields that are generated by each of the vertically stacked power semiconductor devices in a vertically arranged MCM, such as those described herein, as compared to overlap between respective magnetic fields that are generated by horizontally arranged power semiconductor devices in a planar MCM. This increased magnetic field overlap can also increase, in vertically arranged MCMs, magnetic field cancelling between the respective magnetic fields as compared to magnetic field cancelling in horizontally arranged MCMs. As a result, stray inductance in the main current path can be reduced and performance of the vertically stacked MCM can be improved over a schematically equivalent MCM having a horizontal arrangement of power semiconductor devices.

The vertically stacked, MCM circuit assemblies described herein, and shown in the corresponding drawings, can have improved thermal performance as compared with other arrangements, as they allow for dual side cooling. For instance, a first heatsink can be affixed (e.g., coupled, thermally coupled) to a metal layer disposed on (included in) the first (lower) substrate and a second heatsink can be affixed to a metal layer disposed on (included in) the second (upper) substrate. The upper substrate and the lower substrate can each include an insulation layer to provide electrical isolation of the heatsinks from the respective power semiconductor devices.

In example implementations, the inter-substrate can also include an insulation layer that provides electrical isolation between electrical connections to the first power semiconductor device (e.g., on a first side of the inter-substrate) and electrical connections to the second power semiconductor device (e.g., on a second side of the inter-substrate). The inter-substrate can also include through holes (vias) that provide electrical connection between metal conductive patterns on the first side and the second side of the inter-substrate to provide an electrical connection between the first power semiconductor device and the second power semiconductor device (e.g., an electrical connection between an emitter terminal of a first IGBT device a collector terminal of a second IGBT device). The insulation layers of the substrates can include a ceramic/epoxy resin material on which metal layers for electrical and/or thermal conductivity can be disposed.

In some implementations, the metal patterns of the inter-substrate (as well as of the lower substrate and the upper substrate) can have different thicknesses. For instance, relatively thicker metal layers can be used for the main current path of the power semiconductor devices and for attachment of the heatsinks, while relatively thinner (e.g., patterned) metal layers can be used for other signals of a power semiconductor multichip module, such as gate terminal signals, thermal sensing signals, and so forth.

Figure 1B:
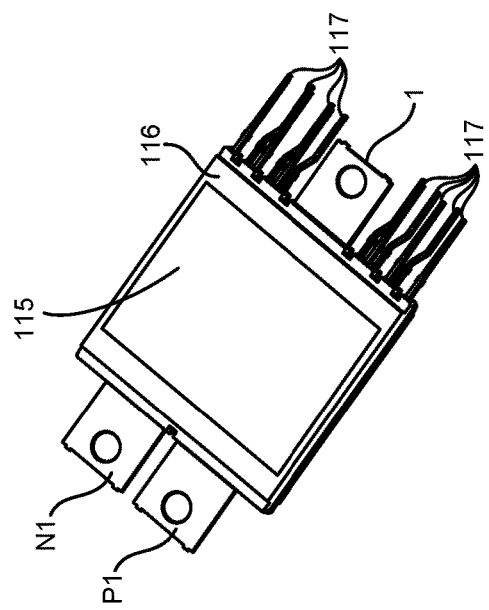
FIG. 1B is a drawing illustrating a circuit assembly that can be used to implement the circuit of FIG. 1A, according to an implementation.
Figure 1A:
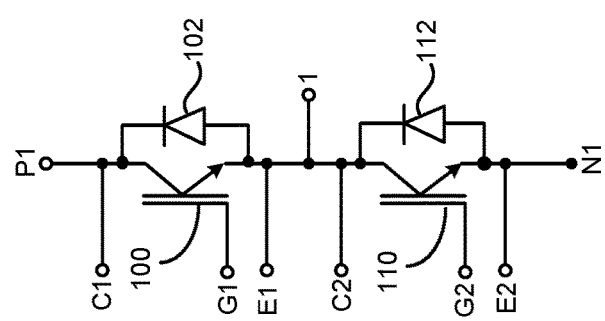
FIG. 1A is a schematic of a power semiconductor module circuit, according to an implementation.

FIG. 1A is a schematic diagram of a power semiconductor module circuit, according to an implementation. The circuit of FIG. 1A is shown by way of example, as a circuit that can be implemented in a vertically stacked, power semiconductor multichip module, such as the implementations described herein. In some implementations, other circuit implementations are possible. As shown in FIG. 1A, the circuit includes two power semiconductor devices, a first IGBT 100 and a second IGBT 110. As shown in FIG. 1A, the circuit also includes a first diode 102 and a second diode 112, as well a number of signal terminals, such as a terminal P1 (power supply terminal), a terminal N1 (ground terminal), and an Output terminal 1. The terminal P1, the Output terminal 1 and the terminal N1 may be referred to as defining (or being included in) a main current path of the circuit of FIG. 1A. In such an implementation, the main current path can be defined as extending from the terminal P1 (e.g., where current from a power supply can enter the circuit), through the IGBT 100, the Output terminal 1 and the IGBT 110, to the terminal N1 (e.g., where current can exit the circuit (e.g., from the Output terminal 1 through the IGBT 110 to the terminal N1). As shown in FIG. 1A, the circuit can also include a number of additional signal terminals, such as respective gate terminals G1 and G2 for the IGBT devices 100 and 110, as well as respective sense terminals E1 and E2 for the emitters of the IGBT devices 100 and 110, and C1 and C2 for the collectors of the IGBT devices 100 and 110. In other certain implementations, the circuit of FIG. 1A can contain other elements, such as thermal sensors (and associated signal terminals for those elements).

FIG. 1B is a drawing illustrating a circuit assembly that can be used to implement the circuit of FIG. 1A, according to an implementation. The circuit assembly shown in FIG. 1B can, for example, include a vertically stacked, power semiconductor MCM, such as those described herein, that implements the circuit of FIG. 1A. For purposes of clarity and illustration, the circuit of FIG. 1A will be described with reference to each of the circuit assembly implementations described herein. It will be appreciated that, in other implementations, other circuits can be implemented using the circuit assemblies described herein.

As shown in FIG. 1B, a metal layer 115 of an outer (first) substrate of a vertically stacked MCM can be exposed through a molding compound 116 used to encapsulate, at least in part, such an MCM. A second metal layer (not shown) of another outer (second) substrate can likewise be exposed thorough the molding compound 116 of the circuit assembly of FIG. 1B, e.g., on an opposite side from the metal layer 115. As described herein, respective heatsinks can be attached to these exposed metal layers to provide dual sided cooling for the circuit assembly of FIG. 1B. Such heatsinks can be passive heatsinks, such as finned metal structures with high thermal conductivity, so as to improve dissipation of heat produced by the associated power semiconductor circuit. Alternatively, the heatsinks can be implemented using active heatsinks, where a coolant liquid (such as water, or the like) can flow through one or more chambers of the active heatsinks, which can further improve their heat transfer performance, such as compared to passive heatsinks.

As can also be seen in FIG. 1B, the circuit assembly includes a number of signal leads corresponding with (that are electrically connected to) the signal terminals shown in FIG. 1, such as the terminal P1, the terminal N1 and the Output terminal 1. The circuit assembly in FIG. 1B also includes additional signal leads 117 that can correspond (be electrically connected) with other signal terminals of the circuit of FIG. 1, such as the sense terminals E1, E2, C1 and C2 discussed above.

FIG. 1C is a flattened, side-view of a circuit assembly that can be used implement the circuit of FIG. 1A and included in the circuit assembly of FIG. 1B, according to an implementation. In the flattened, side-view of the FIG. 1C, as well as other flattened side-views shown in the drawings and described herein, features of the circuit assembly throughout a depth (into the page) of the circuit assembly are shown to illustrate their relationship (their vertical relationship along the axis V, and their horizontal, or lateral relationship along an axis H) to one another. It will be appreciated, therefore, that some features shown in such flattened, side-views would be obscured in a non-flattened side-view, or in a cross-sectional side view taken across a single, linear cut-line. Also, not all features of the circuit assembly are shown in the flattened side view.

As shown in FIG. 1C, the vertically stacked MCM (hereafter "MCM") includes the first IGBT device 100 and the second IGBT device 110, where the IGBT device 100 and 110 are implemented on respective semiconductor dice (chips). As shown in FIG. 1C, the MCM also includes a first outer (lower) substrate 120, a second outer (upper) substrate 130 and an inter-substrate (third substrate) 140 that is disposed between the first IGBT device 100 and the second IGBT device 110. As shown in FIG. 1C, the outer substrates 120 and 130 can each include an externally exposed metal layer (such as the metal layer 115), to which a heatsink can be affixed. Substrates 120 and 130 can also include an insulation (insulating, etc.) layer 135 (e.g., a ceramic/epoxy resin layer) to electrically insulate the externally exposed metal layer (and heatsinks) from the internally facing metal layers 137 that are used to carry electrical signals for the circuit 100, such as is shown in FIG. 1C. Also illustrated in FIG. 1C are locations of the circuit nodes for the terminal P1, the terminal N1 and the Output terminal 1 of the circuit of FIG. 1A. In some implementations, the MCM structure of FIG. 1C can be molded (along with signal leads) to produce the circuit assembly shown in FIG. 1B, such as by using a transfer molding process, or other appropriate molding process to encapsulate at least a portion of the vertically stacked MCM assembly in a molding compound, such as an epoxy molding compound, or other appropriate molding compound.

Figure 2:
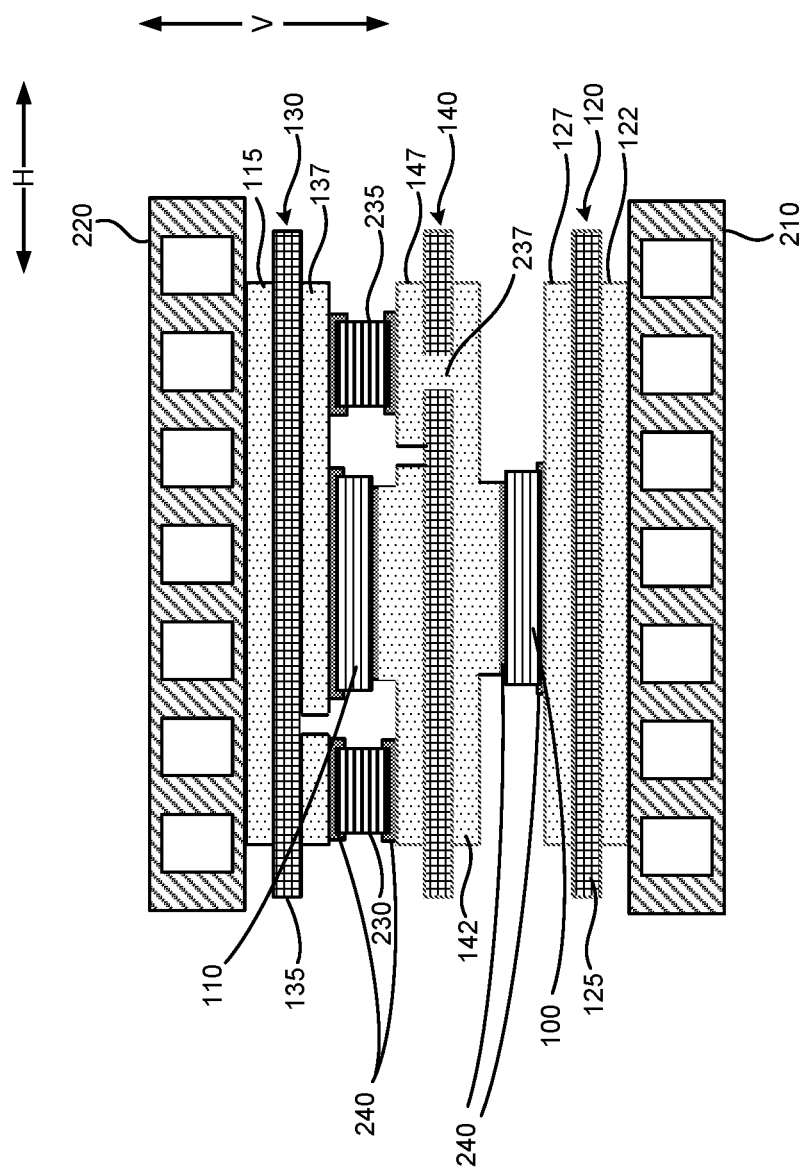
FIG. 2 is a flattened, side-view of the circuit assembly of FIG. 1C further including heatsinks, according to an implementation.

FIG. 2 is a flattened, side-view of the circuit assembly (MCM structure) of FIG. 1C further including heatsinks, according to an implementation. In other implementations, other MCM structures can be used. In the following, the elements of the circuit assembly of FIG. 2 will be described, for purposes of discussion and illustration, in order of their vertical physical arrangement in FIG. 2, starting from the bottom of the circuit assembly and progressing to the top of the circuit assembly along the axis V. The ordering of elements shown in FIG. 2 is that of an assembled MCM circuit assembly. The order in which the elements of the circuit assembly of FIG. 2, or the elements of other such assemblies, are affixed to one another will depend on the particular implementation. In FIG. 2, the terminals N1 and P1 and the Output terminal 1 from FIG. 1C are not shown.

As shown in FIG. 2, the first element at the bottom of the circuit assembly is a first heatsink 210. While an active (e.g., water cooled heatsink) is shown in FIG. 2, in other implementations, other heatsinks, such as passive heatsinks, can be used. Above the first heatsink 210 in the circuit assembly in FIG. 2 is the first (lower) substrate 120. The first heatsink 210 can be affixed to an outer metal layer 122 of the first substrate 120 using a thermally conductive interface or thermal interface material. In some implementations, such a thermally conductive interface can include a metal foil and/or a thermally conductive adhesive, such as a silver epoxy adhesive, for example. The outer metal layer of the substrate 120 (to which the first heatsink 210 is affixed) can be disposed on an insulation layer 125 that electrically isolates the outer metal layer 122 (and the first heatsink 210) from conductive metal layer(s) 127 used to conduct signals for the power semiconductor circuit implemented by the circuit assembly of FIG. 2.

As shown in FIG. 2, the first IGBT device 100 can be affixed to one or more conductive metal layers 127 of the first substrate 120 using electrically conductive materials 240, such as a conductive adhesive material, solder, etc. In this implementation, a collector terminal (backside collector terminal) of the first IGBT 100 can be affixed with the first (lower, bottom, etc.) substrate 120. As further shown in FIG. 2, the first IGBT 100 can be affixed to one or more conductive metal layers 142 of the inter-substrate 140 using an electrically conductive material 240, such as electrically conductive adhesive, solder, etc. For instance, in this example implementation, the inter-substrate 140 can be affixed (electrically connected) with via conductive material 240, at least, an emitter terminal of the first IGBT 100. In such an arrangement, with the emitter terminals of both the IGBTs 100 and 110 coupled with inter-substrate 140, the semiconductor die of the IGBT 110 can be referred to as being flipped (inverted, etc.) relative to the semiconductor die of the IGBT 100. Other signals for the IGBT 100 in the MCM structure can be provided using signals leads 117, such as those shown in FIG. 1B, in combination with printed signal lines, patterned metal layers and/or bond wires, for example.

As illustrated in FIG. 2, the inter-substrate 140 can include an insulation layer 145 that electrically isolates one or more conductive metal patterns 142 on a lower (downward facing) side of the inter-substrate 140 from one or more conductive metal patterns 147 on an upper (upward facing) side of the inter-substrate 140, as shown in FIG. 2. As further shown in FIG. 2, the second IGBT 110 can be affixed to one or more conductive metal layers 137 on a downward facing surface of the second substrate 130 and one or more conductive metal layers 147 on the upper surface of the inter-substrate 140. For instance, electrically conductive material 240 (adhesive, solder, etc.) can be used to affix a collector terminal of the second IGBT 110 with the second substrate 130, such as shown in FIG. 2. Likewise, electrically conductive material 240 (adhesive, solder, etc.) can be used to couple (affix, connect, electrically couple, etc.) an emitter terminal of the second IGBT device 110 with the inter-substrate 140, as shown in FIG. 2. The inter-substrate 140 can be further affixed to the upper substrate 130 via conductive connecters 230 and 235 (e.g., copper posts), such as those shown in FIG. 2. For instance, the conductive connectors 230 and 235 can be affixed in place using electrically conductive adhesive material 240. In the implementation shown in FIG. 2, the conductive connector 235 shown on the right portion of FIG. 2 can be used to establish an electrical connection between the emitter terminal of the first IGBT 100 and the collector terminal of the second IGBT device 110 (e.g., from the first IGBT 100 through the inter-substrate 140, the conductive connector 235 and the upper substrate to the second IGBT 110).

The patterned conductive metal layers 137 on the lower (downward facing) surface of the upper substrate 130 can be disposed on an insulating layer 135 that electrically isolates those patterned conductive metal layers 137 from the outer metal layer 115 on an upper surface of the upper substrate 130. As shown in FIG. 2, a second heatsink 220 (e.g., passive or active) can be affixed (e.g., using a thermally conductive adhesive material) to the outer metal layer 115 of the upper substrate 130. In some implementations, the various metal layers of the MCM structure of FIG. 2 (as well as other MCM structures described herein) can be implemented using copper. In other implementations, other conductive materials, such as conductive metal alloys can be used.

FIG. 3A is flattened, side-view diagram of the MCM circuit assembly of FIG. 1C, showing a main current path 310 for the circuit of FIG. 1A, according to an implementation. In FIG. 3A, the signal terminals associated with the main current path (e.g., the terminal P1, the Output terminal 1 and the terminal N1) are indicated on the MCM structure. Current flow (along current path 310) is shown in terms of a positive current flow and presumes both IGBT devices 100 and 110 are "on" (conducting). It will be appreciated that electron flow would be in an opposite direction than the current flow direction indicated for the current path 310 in FIG. 3A (and for the current path 350 in FIG. 3B).

As shown in FIG. 3A, current (e.g., from a power supply) can enter the terminal P1 of the circuit of FIG. 1A, such as through a signal lead connected to the lower substrate 320. The current (along the current path 310) can then flow through the (e.g., patterned) conductive metal layer 127 on the upper surface of lower substrate 120 and into the collector (backside) terminal of the first IGBT device 100. The current, as shown in FIG. 3A, can then flow through the first IGBT device 100, exit through an emitter (topside) terminal of the first IGBT device 100 and flow into a metal layer 142 on the bottom surface of the inter-substrate 140. The current can then flow through a conductive via 237 (through hole) in the inter-substrate 140, through a patterned metal layer 147 on the upper surface of the inter-substrate 140, and through the conductive connector 235 on the right portion of the MCM assembly and into a metal layer 137 on the bottom side and right portion of the upper substrate 130. In this implementation, the metal layer 142 on the bottom surface of the inter-substrate 140 that is coupled with the emitter terminal of the IGBT 100, the conductive via 237 (through hole) in the inter-substrate 140, the conductive connector 235 on the right side of the MCM assembly and the metal layer 137 on the bottom side and right portion of the upper substrate 130 can be associated with an electrical node for the Output terminal 1 of the circuit of FIG. 1A, such as is shown in FIG. 3A.

The current along the current path 310 can then (from the Output node 1) enter the collector (backside) terminal of the second IGBT 110, flow through the IGBT 110 and out an emitter terminal of the second IGBT 110 into a conductive metal layer 147a on the upper surface of the inter-substrate 140, there the metal layer 147a is isolated from the metal layer 147 that is associated (connected) with the conductive connector 235. The current can then flow out of the MCM, e.g., through the terminal N1. As shown in FIG. 3A, the signal lead for the terminal N1 can be coupled (affixed, electrically coupled, etc.) with a metal layer 137a that is disposed on the bottom surface of the upper substrate. The conductive connector 230 in the left portion of the MCM structure in FIG. 3A, in similar manner as discussed above with respect to the conductive connector 235 in the right portion of the MCM, can be used to electrically connect the metal layer 147a on the inter-substrate 140 (e.g., that is associated with the terminal N1) with the metal layer 127a on the upper substrate (e.g., that is then also associated with the terminal N1).

FIG. 3B is a flattened, side-view diagram of another circuit assembly implementing the circuit of FIG. 1A, showing a main current path 350 in the circuit assembly, according to an implementation. As with the current path shown in FIG. 3A, the current path 350 illustrated in FIG. 3B, with reference to FIG. 1A, shows positive current flow from the terminal P1 through the substrate 320 to the collector terminal of the IGBT 100, through the IGBT 100 to the Output terminal 1 via the emitter terminal of the IGBT 100, from the Output terminal 1 into the collector terminal of the IGBT 110 (which is in an inverted orientation in FIG. 3B than the IGBT 110 in FIG. 3A, where the collector terminal of the IGBT 110 is downward facing in FIG. 3B). The current then flows through the IGBT 110, out its emitter terminal, through a metal layer 333a (on a bottom surface of the upper substrate 330) to the terminal N1 and out of the MCM. As compared to the flipped (inverted) arrangement of the semiconductor die of the IGBTs 100 and 110 in the circuit assembly 1C discussed above, the semiconductor die of the IGBTs 100 and 110 can be referred to as having a same orientation collector on a bottom side and emitter on a top side of the respective semiconductor die of the IGBTs 100 and 110 as shown in FIG. 3C.

The particulars of current flow in the circuit assembly elements of the MCM structure shown in FIG. 3B are evident from the drawing and the foregoing description, and are not described in detail here. Briefly, however, in the MCM structure of FIG. 3B, the Output terminal 1 can be associated with both metal (upper and lower) layers of the inter-substrate 340 shown in FIG. 3B, which are electrically connected by conductive via (through-hole) 337, where a signal on the Output terminal 1 (e.g., the node between the emitter terminal of the IGBT 100 and the collector terminal of the IGBT 110) can be communicated to a metal layer 333 on the bottom surface and right portion of the upper substrate 330 through a conductive connector 335 that is disposed between (and electrically couples, connects, etc.) the inter-substrate 140 and the upper substrate 130.

Figure 4:
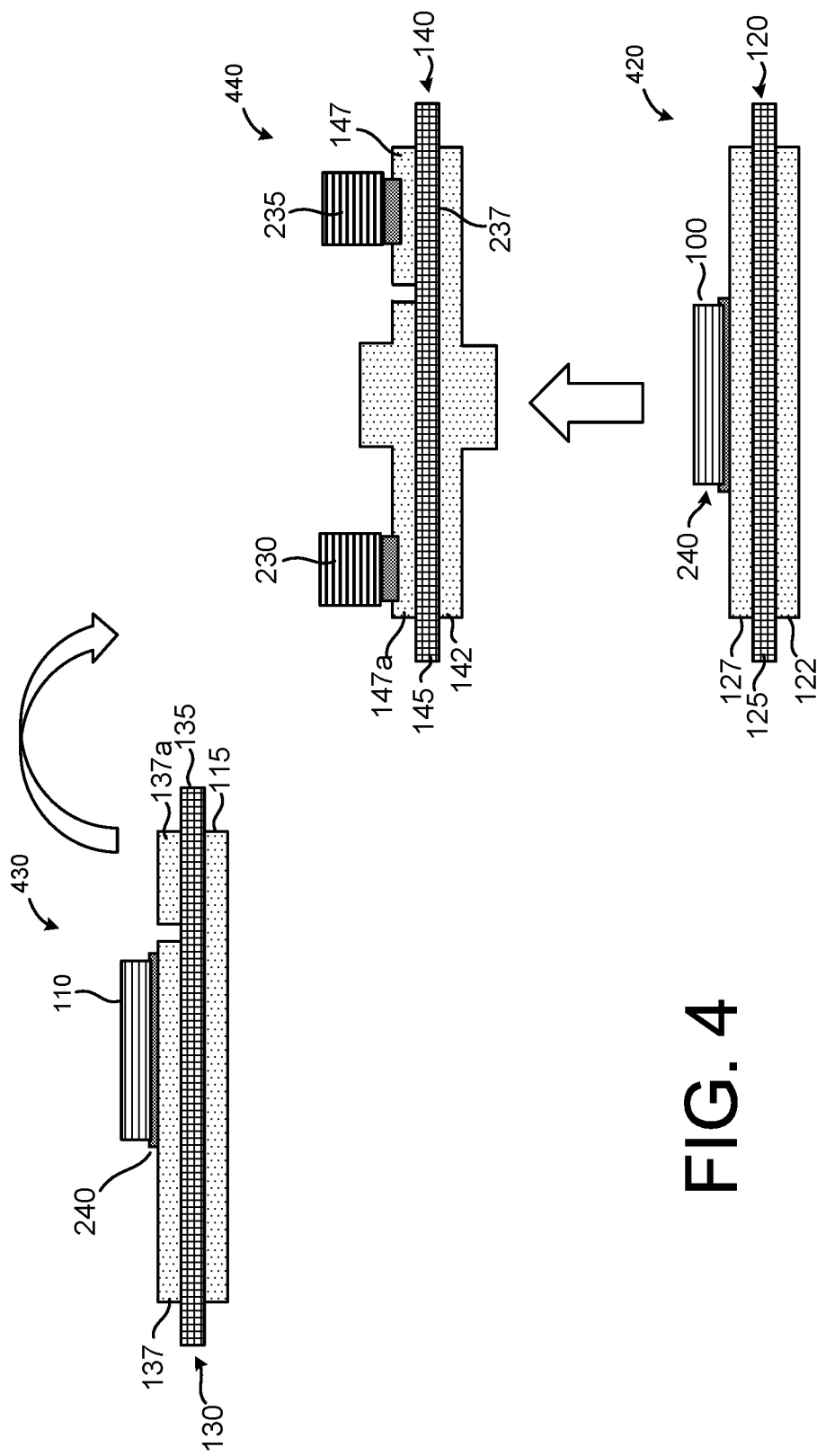
FIG. 4 is a diagram illustrating flattened, side-views of separate substrate assemblies of the circuit assembly of FIG. 1C, according to an implementation.

FIG. 4 is a diagram illustrating flattened side-views of separate substrate assemblies of the circuit assembly of FIG. 1C, according to an implementation. The substrate assemblies include a top substrate assembly 430, an inter-substrate assembly 440 and a bottom substrate assembly 420, according to an implementation. As shown in FIG. 4, the top substrate assembly 430 can include the substrate 130 having multiple conductive/metal layers 115 and 137 (upper and lower) separated by an insulating layer 135, a first power semiconductor device (e.g., the IGBT 110 of the circuit of FIG. 1A implemented on a semiconductor die) and an adhesive material (conductive adhesive material 140) that attaches (affixes, bonds, etc.) the first power semiconductor device (IGBT 110) to the top substrate assembly 130.

As also shown in FIG. 4, the inter-substrate assembly 440 can include the substrate 140 having multiple conductive/metal layers 147, 147a and 142 (e.g., upper and lower layers) separated by an insulating layer 145, and conductive connectors 230 and 235 disposed, respectively on the upper metal conductive layers 147a and 147, where the conductive conductors 230 and 235 establish electrical connections (e.g., of the circuit of FIG. 1) with the top substrate assembly 430, e.g., after inverting the top substrate assembly 430 (as shown in FIG. 4) and affixing it with the inter-substrate assembly 440, such as in the arrangements shown in FIGS. 1C, 2 and 3A. As further shown in FIG. 4, the bottom substrate assembly 420 can include the substrate 120 having multiple conductive/metal layers 127 and 122 (upper and lower) separated by an insulating layer, a second power semiconductor device (e.g., the IGBT 100 of the circuit of FIG. 1A implemented on a semiconductor die) and an adhesive material (conductive adhesive material 240) that attaches (couples, affixes, bonds, electrically couples, etc.) the power semiconductor device (IGBT 100) to the bottom substrate assembly 420. As illustrated in FIG. 4, the bottom substrate assembly 420 can be affixed with the inter-substrate assembly 440, such as in the arrangements shown in FIGS. 1C, 2 and 3A, to establish electrical connections (e.g., of the circuit of FIG. 1A) between the bottom substrate assembly 430 and the inter-substrate assembly 440.

In implementations, such as the example of FIG. 4, the top substrate assembly 430, the inter-substrate assembly 440, the bottom substrate assembly 420, and power terminals (e.g., the terminals P1 and N1) and signal terminals (e.g., the Output terminal 1 and signal leads 117), which can be implemented by a lead frame having one or more portions) can be assembled (affixed to each other, etc.) to produce a vertically stacked MCM using one or more adhesive and/or conductive materials 240, such as conductive epoxy, solder, etc. After assembling the top substrate assembly 430, the inter-substrate assembly 440, the bottom substrate assembly 420, and the power terminals (e.g., the terminals P1 and N1) and the signal terminals (e.g., the Output terminal 1 and signal leads 117), a molding process can be performed, such as a transfer molding process using an epoxy resin molding compound, to encapsulate at least a portion of the assembled components. In implementations, the molding process can produce an assembled, vertically stacked MCM, such as the assembled MCM shown in FIG. 1B. Respective heatsinks can then be affixed with the outer thermally conductive (metal) layers 115 and 122 of the top substrate assembly 430 and the bottom substrate assembly 420, such as in the arrangement shown in FIG. 2.

FIG. 5A is a diagram illustrating a plan view and a corresponding flattened side-view of the top substrate assembly 430 of the circuit assembly of FIG. 4, according to an implementation. In FIG. 5A, as well as in FIGS. 5B-5D and 6A-6D, plan views are shown above their corresponding side views.

As illustrated in FIG. 5A, an IGBT device 110 can be disposed on the top substrate assembly 430 (e.g., a collector terminal of the IGBT device 110 can be electrically coupled with a patterned metal, e.g., copper, layer 137 on the top substrate assembly 430). The top substrate assembly 430 can also include the terminal N1 signal lead for the circuit of FIG. 1A, as well as signal leads 117 connected (e.g., via bond wires) to other terminals of the circuit of FIG. 1A, such as signal leads connected to the gate terminals G2 and the emitter terminal E2 of the IGBT 110 of the top substrate assembly 430 (and the circuit of FIG. 1A). In other implementations, other signal leads 117 can be included, for example, signal leads coupled with a thermal sensor (e.g., not shown) can be included. As also shown in FIG. 5A, the top substrate assembly 430 can include the diode 112 (of the circuit of FIG. 1A) that has one terminal coupled with the patterned metal layer 137 to which the IGBT device 110 of the top substrate assembly 430 is affixed. As shown in FIG. 5A, the Output terminal 1 signal lead can be coupled (e.g., electrically and physically coupled) with the patterned metal layer 137 on which the IGBT device 110 and the diode 112 of the top substrate assembly 430 are affixed (disposed, electrically connected, etc.). As further shown in FIG. 5A, the terminal N1 signal lead can be coupled (e.g., electrically and physically coupled) with a patterned metal layer 137a that is separate (electrically isolated) from the patterned metal layer 137 on which the IGBT device 110 and the diode 112 of the top substrate assembly 430 are affixed (disposed, electrically connected, etc.).

FIG. 5B is a diagram illustrating a plan view and a corresponding flattened side-view of the inter-substrate assembly 440 of the circuit assembly of FIG. 4, according to an implementation. As shown in FIG. 5B, the inter-substrate assembly 440 includes patterned metal layers 147, 147a and 142, conductive connectors 230 and 235, and vias 237 (e.g., conductive vias that extend through the insulating layer 140 of the substrate 140 in the inter-substrate assembly 440).

FIG. 5C is a diagram illustrating a plan view and a corresponding flattened side-view of the bottom substrate assembly 420 of the circuit assembly of FIG. 4, according to an implementation. As illustrated in FIG. 5C, the IGBT device 100 (e.g., a second IGBT device in this example) can be disposed on the substrate 120 of the bottom substrate assembly 420 (e.g., a collector terminal of the IGBT device 100 can be electrically coupled with the patterned metal e.g., copper, layer on the substrate 120 of the bottom substrate assembly 420. The bottom substrate assembly 420 can also include the terminal P1 signal lead for the circuit of FIG. 1A, as well as signal leads 117 connected (e.g., via bond wires) to other terminals of the circuit of FIG. 1A, such as signal leads connected to the gate terminal G1 and the emitter terminal E1 of the IGBT device 100. In other implementations, other signal leads can be included, for example, signal leads coupled with a thermal sensor (e.g., not shown) can be included. As also shown in FIG. 5C, the bottom substrate assembly 420 can include the diode 102 (of the circuit of FIG. 1A) that has one terminal coupled with the patterned metal layer 127 to which the IGBT device 100 is affixed. As shown in FIG. 5C, the terminal P1 signal lead can be coupled (e.g., electrically and physically coupled) with the patterned metal layer 127 on which the IGBT device 100 and the diode 102 of the bottom substrate assembly 420 are affixed (disposed, electrically connected, etc.).

FIG. 5D is a diagram illustrating a flattened plan view of a multichip module including the circuit assembly of FIG. 4 and a corresponding flattened side-view of the circuit assembly, according to an implementation. In the flattened, plan view of FIG. 5D, elements of the top substrate assembly 430, the inter-substrate assembly 440 and the bottom substrate assembly 420 are shown to indicate their arrangement in the circuit assembly. It will be appreciated that these elements may be within the vertically stacked MCM of FIG. 5D (and, therefore, not visible). Such elements in FIG. 5D are shown for purposes of illustration.

FIG. 5E is a diagram illustrating a package outline view of the multichip module of FIG. 5D (e.g., after molding), according to an implementation. The plan view of FIG. 5E illustrates the exposed metal layer 115 of the top substrate assembly 430, to which a heatsink can be attached, such as in the arrangement shown in FIG. 2.

Figure 6E:
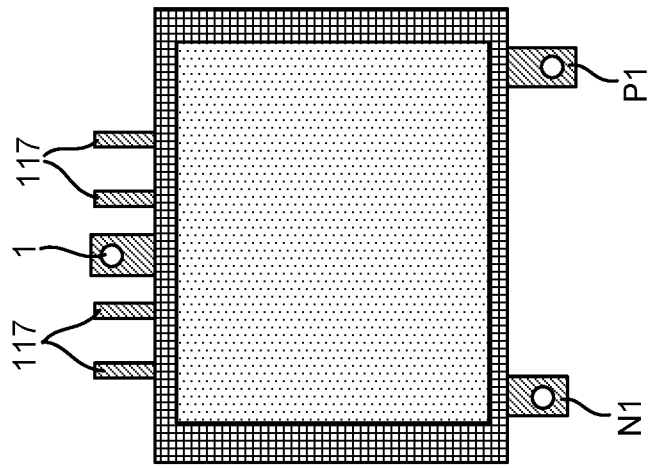
FIG. 6E is a diagram illustrating a package outline view of the multichip module of 6D, according to an implementation.
Figure 6D:
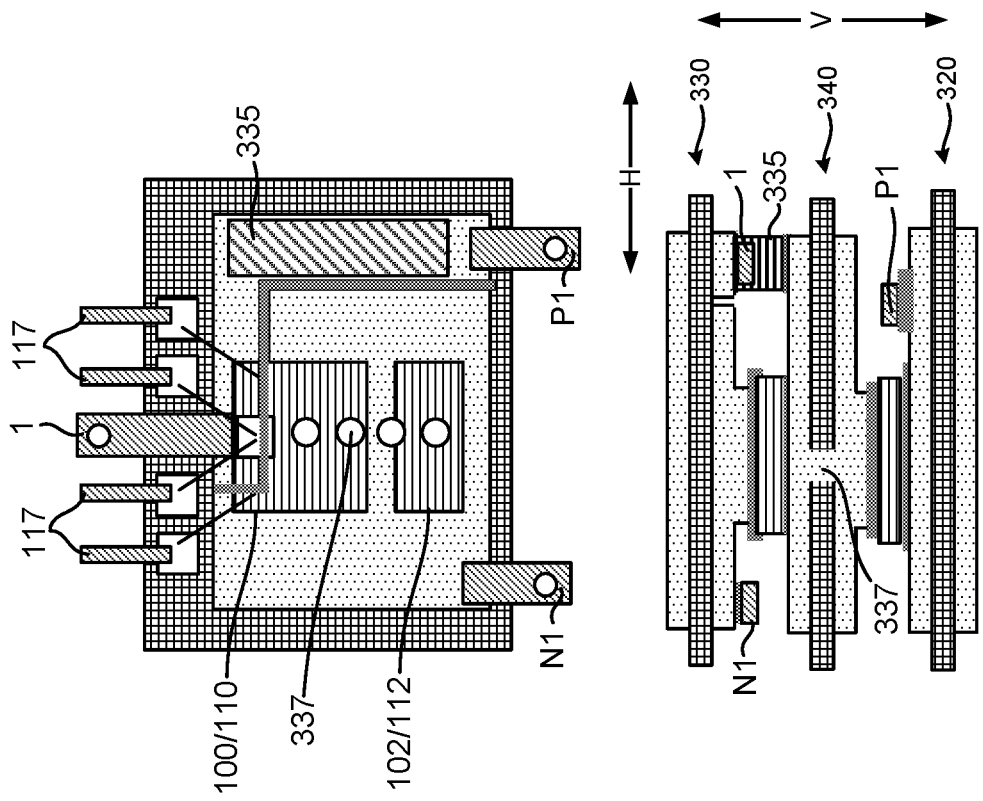
FIG. 6D is a diagram illustrating a plan view of a multichip module including the circuit assembly of FIG. 3B and a corresponding flattened, side-view, according to an implementation.

FIGS. 6A-6E illustrate views similar to the those of FIG. 5A-5E showing a top substrate assembly 630, an inter-substrate assembly 640 and a bottom substrate assembly 630 of the vertically-stacked MCM of FIG. 3B. FIG. 6A is a diagram illustrating a plan view and a corresponding flattened side-view of the top substrate assembly 630 of the circuit assembly of FIG. 3B, according to an implementation. FIG. 6B is a diagram illustrating a plan view and a corresponding flattened side-view of the inter-substrate assembly 640 of the circuit assembly of FIG. 3B, according to an implementation. FIG. 6C is a diagram illustrating a plan view and a corresponding flattened side-view of the bottom substrate assembly 620 of the circuit assembly of FIG. 3B, according to an implementation. FIG. 6D is a diagram illustrating a flattened plan view of a multichip module including the circuit assembly of FIG. 3B and a corresponding flattened side view of the circuit assembly of FIG. 3B, according to an implementation. FIG. 6E is a diagram illustrating a package outline view of the multichip module of 6D (e.g., after molding), according to an implementation.

As with the plan view of FIG. 5D, elements shown in FIGS. 6B and 6D may be disposed on an opposite side of the inter-substrate (FIG. 6B) or with within the vertically stacked MCM assembly (as shown in FIG. 6D) and, therefore, may be not visible in those views of the circuit assembly. Those elements in FIGS. 6B and 6D are, however, shown for purposes of illustration. In the implementation of FIGS. 6A-6E, as compared with the implementation of FIGS. 5A-5E, the IGBT device 110 and the diode 112 of the circuit of FIG. 1A are disposed on the inter-substrate assembly 640, rather than on the top substrate assembly. Further, the location of the conductive vias 337 of the inter-substrate 340 of FIG. 6B are located in vertical alignment with the IGBT 110, as is further illustrated by the side view of the inter-substrate shown in FIG. 6B (and in FIG. 3B). Further in FIGS. 6A-6E, elements of the MCM circuit assembly of FIG. 3B are referenced with like reference numbers as FIG. 3B, though those each of those elements is not explicitly discussed with respect to FIGS. 6A-6E.

Figure 7:
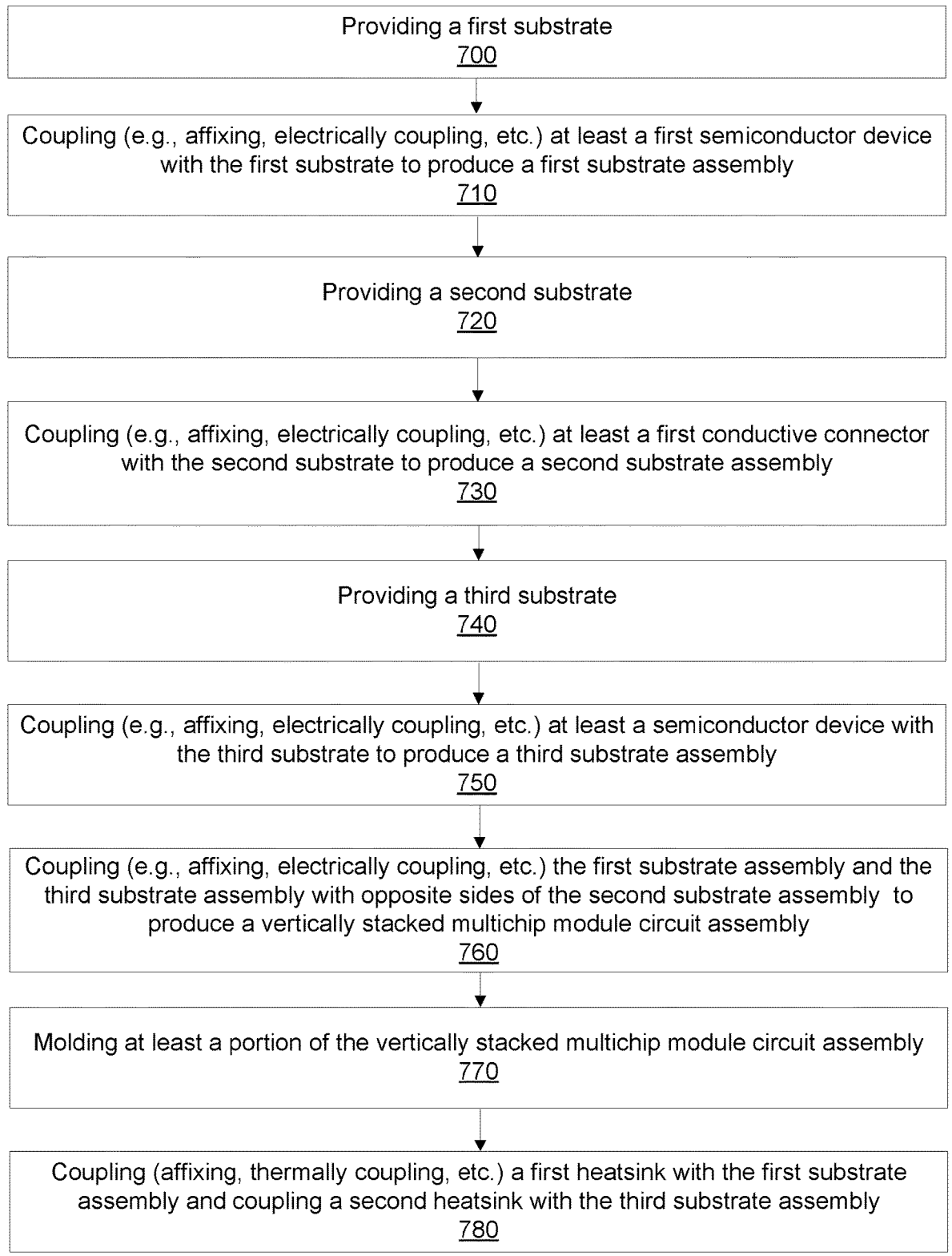
FIG. 7 is a flowchart illustrating a method for producing a vertically stacked multichip module (circuit assembly), such as, e.g., the circuit assemblies of FIG. 1C and/or FIG. 2, in accordance with an implementation.

FIG. 7 is a flowchart illustrating a method for producing a vertically stacked multichip module (circuit assembly), such as, e.g., the circuit assemblies of FIG. 1C, FIG. 2, FIG. 4 and/or FIGS. 5A-5E, in accordance with an implementation. Accordingly, the method of FIG. 7 will be described with further reference to the elements shown in those drawings.

The method of FIG. 7, at block 700, includes providing a first substrate, such as the substrate 130. At block 710, the method of FIG. 7 includes coupling (affixing, electrically coupling, etc.) at least a first semiconductor device (e.g., IGBT 110 and/or diode 112) to the first substrate 130 to produce a first substrate assembly 430. The method of FIG. 7 includes, at block 720, providing a second substrate, such as the inter-substrate 140 and, at block 730, coupling (affixing, electrically coupling, etc.) at least a first conductive connector (e.g., conductive connecter 230 and/or conductive connecter 235) to the second substrate 140 to produce a second substrate assembly 440. The method of FIG. 7 includes, at block 740, providing a third substrate, such as the substrate 120 and, at block 750, coupling (affixing, electrically coupling, etc.) at least a second semiconductor device (e.g., IGBT 100 and/or diode 102) to the third substrate 120 to produce a third substrate assembly 420. At block 760, the method includes coupling (e.g., affixing, electrically coupling, etc.) the first substrate assembly 430 and the third substrate 420 assembly with opposite sides of the second substrate assembly 440 to produce a vertically stacked multichip module circuit assembly, such as the circuit assembly illustrated in FIG. 1C. At block 770, the method of FIG. 7 can include molding (e.g., using an EMC or other molding compound), at least a portion of the vertically stacked multichip module circuit assembly of block 760. At block 780, the method of FIG. 7 can include coupling (affixing, thermally coupling, etc.) a first heatsink 220 with the first substrate assembly 430 (e.g., with the first substrate 130) and coupling a second heatsink 210 with the third substrate assembly 420 (e.g., with the third substrate 120).

In some implementations, the method of FIG. 7 can include coupling signal terminals, such as signal terminals N1 and P1, the Output terminal 1, and signal leads 117 to the vertically stacked circuit assembly of block 760. For example, signal terminals could be coupled with the circuit assembly prior to molding at block 770.

Figure 8:
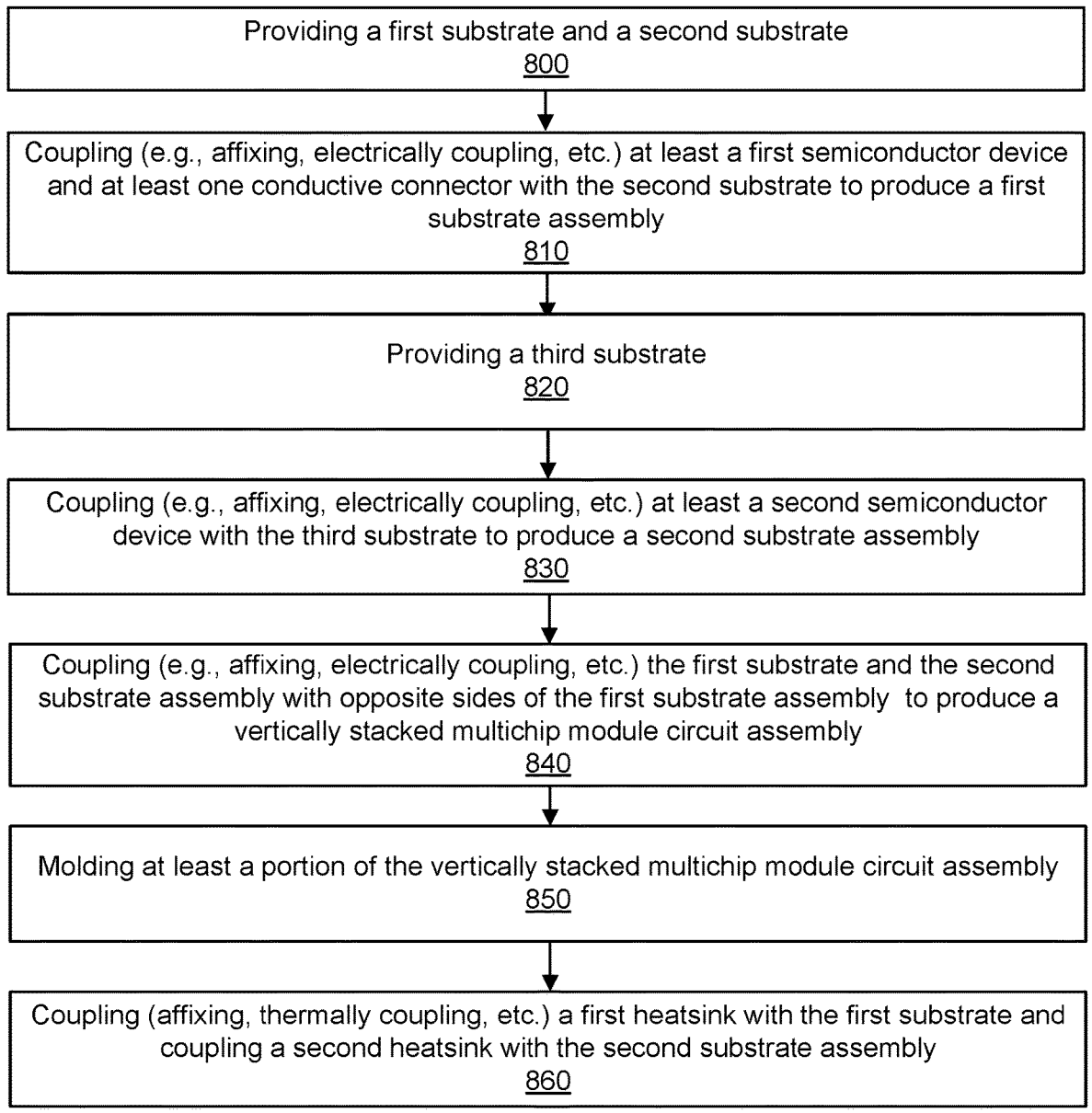
FIG. 8 is a flowchart illustrating methods for producing a vertically stacked multichip modules, such as, e.g., circuit assembly of FIG. 3B, in accordance with an implementation.

FIG. 8 is a flowchart illustrating a method for producing a vertically stacked multichip module (circuit assembly), such as, e.g., the circuit assemblies of FIG. 3B (including heatsinks, such as shown in FIG. 2) and/or FIGS. 6A-6E, in accordance with an implementation. Accordingly, the method of FIG. 8 will be described with further reference to the elements shown in those drawings.

The method of FIG. 8, at block 800, includes providing a first substrate (e.g., the substrate 330 or the substrate assembly 630) and a second substrate (e.g., the inter-substrate 340). At block 810, the method of FIG. 8 includes coupling (affixing, electrically coupling, etc.) at least a first semiconductor device (e.g., IGBT 110 and/or diode 112) and at least one conductive connecter (e.g., the conductive connector 335) to the second substrate 340 to produce a first substrate assembly 640. The method of FIG. 8 includes, at block 820, providing a third substrate, such as the substrate 420 and, at block 830, coupling (affixing, electrically coupling, etc.) at least a second semiconductor device (e.g., IGBT 100 and/or diode 102) to the third substrate 420 to produce a second substrate assembly 620. At block 840, the method of FIG. 8 includes coupling (e.g., affixing, electrically coupling, etc.) the first substrate 330 and the second substrate assembly 620 with opposite sides of the first substrate assembly 640 to produce a vertically stacked multichip module circuit assembly, such as illustrated in FIG. 3B. At block 850, the method of FIG. 8 can include molding (e.g., using an EMC or other molding compound), at least a portion of the vertically stacked multichip module circuit assembly of block 840. At block 860, the method of FIG. 8, in similar manner as at block 780 of FIG. 7, can include coupling (affixing, thermally coupling, etc.) a first heatsink 220 with the first substrate 330 and coupling a second heatsink 210 with the second substrate assembly 620 (e.g., with the third substrate 320).

In some implementations, the method of FIG. 8 can further include coupling signal terminals, such as signal terminals N1 and P1, the Output terminal 1, and signal leads 117 to the vertically stacked circuit assembly. For example, signal terminals could be coupled with the circuit assembly prior to molding at block 850.

In a first example, a circuit assembly apparatus can include a first semiconductor die; a second semiconductor die; and a substrate. The substrate can include an insulating layer; a first metal layer disposed on a first side of the insulating layer, a first side of the first semiconductor die being disposed on and electrically coupled with the first metal layer; a second metal layer disposed on a second side of the insulating layer, the second side of the insulating layer being opposite the first side of the insulating layer, a first side of the second semiconductor die being disposed on and electrically coupled with the second metal layer; and a conductive via disposed through the insulating layer, the conductive via electrically coupling the first metal layer with the second metal layer, the first metal layer, the conductive via and the second metal layer electrically coupling the first semiconductor die with the second semiconductor die.

In a second example based on the first example, the substrate can be a first substrate, the insulating layer can be a first insulating layer, and the circuit assembly apparatus can include a second substrate. The second substrate can have: a second insulating layer; a third metal layer disposed on a first side of the second insulating layer, a second side of the first semiconductor die being disposed on and electrically coupled with the third metal layer, the second side of the first semiconductor die being opposite the first side of the first semiconductor die; and a fourth metal layer disposed on a second side of the second insulating layer, the second side of the second insulating layer being opposite the first side of the second insulating layer, the second insulating layer electrically insulating the third metal layer from the fourth metal layer.

In a third example, based on the second example, the circuit assembly apparatus can include a heatsink coupled to the fourth metal layer, the heatsink being coupled to the fourth metal layer with a thermally conductive material.

In a fourth example, based on the first example, the substrate can be a first substrate, the insulating layer can be a first insulating layer, and the circuit assembly apparatus can include a second substrate. The second substrate can include: a second insulating layer; a third metal layer disposed on a first side of the second insulating layer, a second side of the second semiconductor die being disposed on and electrically coupled with the third metal layer, the second side of the second semiconductor die being opposite the first side of the second semiconductor die; and a fourth metal layer disposed on a second side of the second insulating layer, the second side of the second insulating layer being opposite the first side of the second insulating layer, the second insulating layer electrically insulating the third metal layer from the fourth metal layer.

In a fifth example based on the fourth example, the circuit assembly apparatus can include a heatsink coupled to the fourth metal layer, the heatsink being coupled to the fourth metal layer with a thermally conductive material.

In a sixth example based on the fourth example, the circuit assembly apparatus can include: a fifth metal layer disposed on the first side of the second insulating layer, the fifth metal layer being electrically isolated from the third metal layer; and a conductive connector being disposed between the second metal layer and the fifth metal layer, the conductive connector electrically coupling the second metal layer with the fifth metal layer.

In a seventh example based on the sixth example, the circuit assembly apparatus can include a third substrate having: a third insulating layer; a sixth metal layer disposed on a first side of the third insulating layer, a second side of the first semiconductor die being disposed on and electrically coupled with the sixth metal layer, the second side of the first semiconductor die being opposite the first side of the first semiconductor die; and a seventh metal layer disposed on a second side of the third insulating layer, the second side of the third insulating layer being opposite the first side of the third insulating layer, the third insulating layer electrically insulating the sixth metal layer from the seventh metal layer.

In an eighth example based on the seventh example, the circuit assembly apparatus can include a first heatsink coupled to the fourth metal layer; and a second heatsink coupled to the seventh metal layer. The first heatsink can be coupled to the fourth metal layer and the second heatsink can be coupled to the seventh metal layer with a thermally conductive material.

In a ninth example based on the seventh example, the circuit assembly apparatus can include a ground terminal electrically coupled with the third metal layer; an output terminal electrically coupled with the fifth metal layer; and a power supply terminal electrically coupled with the sixth metal layer.

In a tenth example, a circuit assembly apparatus can include a first semiconductor die; a second semiconductor die; and a substrate. The substrate can include: an insulating layer; a first metal layer disposed on a first side of the insulating layer, a first side of the first semiconductor die being disposed on and electrically coupled with the first metal layer; a second metal layer disposed on a second side of the insulating layer, the second side of the insulating layer being opposite the first side of the insulating layer, a first side of the second semiconductor die being disposed on and electrically coupled with the second metal layer, the insulating layer electrically isolating the first metal layer from the second metal layer; a third metal layer disposed on the second side of the insulating layer, the third metal layer being electrically isolated from the second metal layer; and a conductive via disposed through the insulating layer, the conductive via electrically coupling the first metal layer with the third metal layer. The first metal layer and the conductive via can electrically couple the first semiconductor die with the third metal layer.

In an eleventh example based on the tenth example, the substrate can be a first substrate, the insulating layer can be a first insulating layer, and the circuit assembly apparatus can include a second substrate. The second substrate can have: a second insulating layer; a fourth metal layer disposed on a first side of the second insulating layer, a second side of the first semiconductor die being disposed on and electrically coupled with the third metal layer, the second side of the first semiconductor die being opposite the first side of the first semiconductor die; and a fifth metal layer disposed on a second side of the second insulating layer, the second side of the second insulating layer being opposite the first side of the second insulating layer, the second insulating layer electrically insulating the fourth metal layer from the fifth metal layer.

In a twelfth example based on the eleventh example, the circuit assembly apparatus can include a heatsink coupled to the fifth metal layer, the heatsink being coupled to the fifth metal layer with a thermally conductive material.

In a thirteenth example, based on the tenth example, the substrate can be a first substrate, the insulating layer can be a first insulating layer, and the circuit assembly apparatus can include a second substrate. The second substrate can have: a second insulating layer; a fourth metal layer disposed on a first side of the second insulating layer, a second side of the second semiconductor die being disposed on and electrically coupled with the fourth metal layer, the second side of the second semiconductor die being opposite the first side of the second semiconductor die; a conductive connector being disposed between the third metal layer and the fourth metal layer, the conductive connector electrically coupling the third metal layer with the fourth metal layer, the first metal layer, the conductive via, the third metal layer, the conductive connector and the fourth metal layer electrically coupling the first semiconductor die with the second semiconductor die; and a fifth metal layer disposed on a second side of the second insulating layer, the second side of the second insulating layer being opposite the first side of the second insulating layer, the second insulating layer electrically insulating the fifth metal layer from the fourth metal layer.

In a fourteenth example based on the thirteenth example, the circuit assembly apparatus can include a heatsink coupled to the fifth metal layer, the heatsink being coupled to the fifth metal layer with a thermally conductive material.

In a fifteenth example based on the thirteenth example, the conductive connector can be a first conductive connector, and the circuit assembly apparatus can include: a sixth metal layer disposed on the first side of the second insulating layer, the sixth metal layer being electrically isolated from the fourth metal layer, the second insulating layer electrically isolating the fifth metal layer from the sixth metal layer; and a second conductive connector disposed between the second metal layer and the sixth metal layer, the second conductive connector electrically coupling the second metal layer with the sixth metal layer.

In a sixteenth example, based on the fifteenth example, the circuit assembly apparatus can include a third substrate having: a third insulating layer; a seventh metal layer disposed on a first side of the third insulating layer, a second side of the first semiconductor die being disposed on and electrically coupled with the seventh metal layer, the second side of the first semiconductor die being opposite the first side of the first semiconductor die; and an eighth metal layer disposed on a second side of the third insulating layer, the second side of the third insulating layer being opposite the first side of the third insulating layer, the third insulating layer electrically insulating the seventh metal layer from the eighth metal layer.

In a seventeenth example based on the sixteenth example, the circuit assembly apparatus can include: a first heatsink coupled to the fifth metal layer; and a second heatsink coupled to the eighth metal layer. The first heatsink can be coupled to the fifth metal layer and the second heatsink can be coupled to the eighth metal layer with a thermally conductive material.

In an eighteenth example based on the sixteenth example, the circuit assembly apparatus can include: a ground terminal electrically coupled with the sixth metal layer; an output terminal electrically coupled with the fourth metal layer; and a power supply terminal electrically coupled with the seventh metal layer.

In a nineteenth example, a circuit assembly apparatus can include: a first semiconductor die; a second semiconductor die; a first substrate; a second substrate; and a third substrate. The first semiconductor die can have a first side coupled with a first side of the first substrate and a first side of the second substrate. The second semiconductor die can have a first side coupled with a second side of the second substrate and a first side of the third substrate. The first substrate, the first semiconductor die, the second substrate, the second semiconductor die and the third substrate can be arranged in a vertical stack, such that current flows in the circuit assembly apparatus from the first substrate to the third substrate through the first semiconductor die, the second substrate and the second semiconductor die.

In a twentieth example based on the nineteenth example, the circuit assembly apparatus can include at least one conductive connector electrically coupling the second substrate with the third substrate, the at least one conductive connector being included in a current path between the first substrate and the third substrate.

It will be understood that, in the foregoing description, when an element, such as a layer, a region, or a substrate, is referred to as being on, connected to, electrically connected to, coupled to, or electrically coupled to another element, it may be directly on, connected or coupled to the other element, or one or more intervening elements may be present. In contrast, when an element is referred to as being directly on, directly connected to or directly coupled to another element or layer, there are no intervening elements or layers present. Although the terms directly on, directly connected to, or directly coupled to may not be used throughout the detailed description, elements that are shown as being directly on, directly connected or directly coupled can be referred to as such. The claims of the application may be amended to recite exemplary relationships described in the specification or shown in the figures.

As used in this specification, a singular form may, unless definitely indicating a particular case in terms of the context, include a plural form. Spatially relative terms (e.g., over, above, upper, under, beneath, below, lower, top, bottom, and so forth) are intended to encompass different orientations of the device in use or operation in addition to the orientation depicted in the figures. In some implementations, the relative terms above and below can, respectively, include vertically above and vertically below. In some implementations, the term adjacent can include laterally adjacent to or horizontally adjacent to.

Some implementations may be implemented using various semiconductor processing and/or packaging techniques. Some implementations may be implemented using various types of semiconductor processing techniques associated with semiconductor substrates including, but not limited to, for example, Silicon (Si), Silicon Carbide (SiC), Galium Arsenide (GaAs), Galium Nitride (GaN), and/or so forth.

While certain features of the described implementations have been illustrated as described herein, many modifications, substitutions, changes and equivalents will now occur to those skilled in the art. It is, therefore, to be understood that the appended claims are intended to cover all such modifications and changes as fall within the scope of the implementations. It should be understood that they have been presented by way of example only, not limitation, and various changes in form and details may be made. Any portion of the apparatus and/or methods described herein may be combined in any combination, except mutually exclusive combinations. The implementations described herein can include various combinations and/or sub-combinations of the functions, components and/or features of the different implementations described.

What is claimed is:

1. A method for producing a circuit assembly, the method comprising:

coupling a first side of a first semiconductor die with a first metal layer disposed on a first side of a first insulating layer of a first substrate, the first semiconductor die being electrically coupled with the first metal layer;

coupling a first side of a second semiconductor die with a second metal layer disposed on a second side of the first insulating layer, the second side of the first insulating layer being opposite the first side of the first insulating layer, the first side of the second semiconductor die being electrically coupled with the second metal layer; and coupling a second side of the first semiconductor die with a third metal layer disposed on a first side of a second insulating layer of a second substrate, the second side of the first semiconductor die being electrically coupled with the third metal layer, the second side of the first semiconductor die being opposite the first side of the first semiconductor die, the first substrate including a conductive via disposed through the first insulating layer, the conductive via electrically coupling the first metal layer with the second metal layer, the first metal layer, the conductive via and the second metal layer electrically coupling the first semiconductor die with the second semiconductor die, and the second substrate including a fourth metal layer disposed on a second side of the second insulating layer, the second side of the second insulating layer being opposite the first side of the second insulating layer, the fourth metal layer being electrically isolated from the third metal layer by the second insulating layer.

2. The method of claim 1, further comprising coupling a heatsink to the fourth metal layer, the heatsink being coupled to the fourth metal layer with a thermally conductive material.

3. The method of claim 1, further comprising:
coupling a second side of the second semiconductor die with a fifth metal layer disposed on a third insulating layer of a third substrate, the second side of the second semiconductor die being electrically coupled with the fifth metal layer, the second side of the second semiconductor die being opposite the first side of the second semiconductor die,
the third substrate including a sixth metal layer disposed on a second side of the third insulating layer, the second side of the third insulating layer being opposite the first side of the third insulating layer, the sixth metal layer being electrically isolated from the fifth metal layer by the third insulating layer.

4. The method of claim 3, further comprising coupling a heatsink to the sixth metal layer, the heatsink being coupled to the sixth metal layer with a thermally conductive material.

5. The method of claim 3, wherein:
the second substrate includes a seventh metal layer disposed on the first side of the second insulating layer, the seventh metal layer being electrically isolated from the third metal layer, the method further comprising:
coupling a conductive connector between the second metal layer and the seventh metal layer, the conductive connector electrically coupling the second metal layer with the seventh metal layer.

6. The method of claim 5, further comprising:
coupling a ground terminal with the fifth metal layer, the ground terminal being electrically coupled with the fifth metal layer;
coupling an output terminal with the seventh metal layer, the output terminal being electrically coupled with the seventh metal layer; and
coupling a power supply terminal with the third metal layer, the power supply terminal being electrically coupled with the third metal layer.

7. The method of claim 6, wherein:
the first semiconductor die includes a first insulated-gate bipolar transistor (IGBT); and
the second semiconductor die includes a second IGBT.

8. The method of claim 3, further comprising:
coupling a first heatsink to the fourth metal layer; and
coupling a second heatsink to the sixth metal layer,
the first heatsink being coupled to the fourth metal layer and the second heatsink being coupled to the sixth metal layer with a thermally conductive material.

9. A method for producing a circuit assembly, the method comprising:
coupling a first side of a first semiconductor die with a first metal layer disposed on a first side of a first insulating layer of a first substrate, the first side of the first semiconductor die being electrically coupled with the first metal layer;
coupling a first side of a second semiconductor die with a second metal layer disposed on a second side of the first insulating layer, the second side of the first insulating layer being opposite the first side of the first insulating layer, the first side of the second semiconductor die being electrically coupled with the second metal layer, the first insulating layer electrically isolating the first metal layer from the second metal layer, the first substrate including a third metal layer disposed on the second side of the first insulating layer, the third metal layer being electrically isolated from the second metal layer, the first substrate also including a conductive via disposed through the first insulating layer, the conductive via electrically coupling the first metal layer with the third metal layer;
coupling a second side of the second semiconductor die with a fourth metal layer disposed on a first side of a second insulating layer of a second substrate, the second semiconductor die being electrically coupled with the fourth metal layer, the second side of the second semiconductor die being opposite the first side of the second semiconductor die; and
coupling a conductive connector between the third metal layer and the fourth metal layer, the conductive connector electrically coupling the third metal layer with the fourth metal layer, the first metal layer, the conductive via, the third metal layer, the conductive connector and the fourth metal layer electrically coupling the first semiconductor die with the second semiconductor die,
the first substrate including a conductive via disposed through the first insulating layer, the conductive via electrically coupling the first metal layer with the third metal layer, the first metal layer and the conductive via electrically coupling the first semiconductor die with the third metal layer, and
the second substrate including a fifth metal layer disposed on a second side of the second insulating layer, the second side of the second insulating layer being opposite the first side of the second insulating layer, the fifth metal layer being electrically isolated from the fourth metal layer by the second insulating layer.

10. The method of claim 9, further comprising:
coupling a second side of the first semiconductor die with a sixth metal layer disposed on a first side of a third insulating layer of a third substrate, the second side of the first semiconductor die being electrically coupled with the sixth metal layer, the second side of the first semiconductor die being opposite the first side of the first semiconductor die,
the third substrate including a seventh metal layer disposed on a second side of the third insulating layer, the second side of the third insulating layer being opposite the first side of the second insulating layer, the seventh metal layer being electrically isolated from the sixth metal layer by the third insulating layer.

11. The method of claim 10, further comprising coupling a heatsink to the seventh metal layer, the heatsink being coupled to the seventh metal layer with a thermally conductive material.

12. The method of claim 9, further comprising coupling a heatsink to the fifth metal layer, the heatsink being coupled to the fifth metal layer with a thermally conductive material.

13. The method of claim 9, wherein the conductive connector is a first conductive connector, the second substrate further including:
a sixth metal layer disposed on the first side of the second insulating layer, the sixth metal layer being electrically isolated from the fourth metal layer, the second insulating layer electrically isolating the fifth metal layer from the sixth metal layer; and
a second conductive connector disposed between the second metal layer and the sixth metal layer, the second conductive connector electrically coupling the second metal layer with the sixth metal layer.

14. The method of claim 13, further comprising:
coupling a second side of the first semiconductor die with a seventh metal layer disposed on a first side of a third insulating layer of a third substrate, the second side of the first semiconductor die being electrically coupled with the seventh metal layer, the second side of the first semiconductor die being opposite the first side of the first semiconductor die, the third substrate including an eighth metal layer disposed on a second side of the third insulating layer, the second side of the third insulating layer being opposite the first side of the third insulating layer, the eighth metal layer being electrically isolated from the seventh metal layer by the third insulating layer.

15. The method of claim 14, further comprising:
coupling a first heatsink coupled to the fifth metal layer; and
coupling a second heatsink coupled to the eighth metal layer,
the first heatsink being coupled to the fifth metal layer and the second heatsink being coupled to the eighth metal layer with a thermally conductive material.

16. The method of claim 14, further comprising:
coupling a ground terminal with the sixth metal layer, the ground terminal being electrically coupled with the sixth metal layer;
coupling an output terminal with the fourth metal layer, the output terminal being coupled with the fourth metal layer; and
coupling a power supply terminal with the seventh metal layer, the power supply terminal being coupled with the seventh metal layer.

17. The method of claim 9, wherein:
the first semiconductor die includes a first insulated-gate bipolar transistor (IGBT); and
the second semiconductor die includes a second IGBT.

18. A method for producing a circuit assembly, the method comprising:
coupling a first side of a first semiconductor die with a first side of a first substrate and a first side of a second substrate, the first substrate having a first electrically isolated metal layer disposed on a second side, the second side of the first substrate being opposite the first side of the first substrate;
coupling a first side of a second semiconductor die with a second side of the second substrate and a first side of a third substrate, the third substrate having a second electrically isolated metal layer disposed on a second side, the second side of the third substrate being opposite the first side of the third substrate; and
coupling at least one conductive connector between the second substrate and the third substrate, the at least one conductive connector electrically coupling the second substrate with the third substrate,
the first substrate, the first semiconductor die, the second substrate, the second semiconductor die and the third substrate being arranged in a vertical stack, such that current flows in the circuit assembly from the first substrate to the third substrate through the first semiconductor die, the second substrate, the second semiconductor die, and the at least one conductive connector.

19. The method of claim 18, wherein:
the first semiconductor die includes a first insulated-gate bipolar transistor (IGBT); and
the second semiconductor die includes a second IGBT.

* * * * *